(12) United States Patent
Kimura

(10) Patent No.: US 12,601,767 B2
(45) Date of Patent: Apr. 14, 2026

(54) CURRENT SENSE AMPLIFIER

(71) Applicant: WILL SEMICONDUCTOR (SHANGHAI) CO. LTD., Shanghai (CN)

(72) Inventor: Hiroyuki Kimura, Sendai (JP)

(73) Assignee: WILL SEMICONDUCTOR (SHANGHAI) CO. LTD., Shanghai (CN)

( * ) Notice: Subject to any disclaimer, the term of this patent is extended or adjusted under 35 U.S.C. 154(b) by 200 days.

(21) Appl. No.: 18/642,202

(22) Filed: Apr. 22, 2024

(65) Prior Publication Data

US 2025/0237679 A1     Jul. 24, 2025

(30) Foreign Application Priority Data

Jan. 22, 2024    (JP) ................................. 2024-007270

(51) Int. Cl.
*G01R 1/30*          (2006.01)
*G01R 19/00*         (2006.01)
(Continued)

(52) U.S. Cl.
CPC ......... *G01R 19/0023* (2013.01); *G01R 19/10* (2013.01); *H03F 3/45475* (2013.01); *H03F 2200/129* (2013.01); *H03F 2200/462* (2013.01)

(58) Field of Classification Search
CPC ..... G01R 19/0023; G01R 19/10; G05F 1/575; H03F 3/45475; H03F 3/45071;
(Continued)

(56) References Cited

U.S. PATENT DOCUMENTS 7,898,329 B1 *   3/2011   Clara ................... H03F 3/45475
                                                    330/254
8,144,813 B2 *   3/2012   Nakamura ......... H04B 10/6933
                                                    375/345
(Continued)

OTHER PUBLICATIONS

"DRV8706-Q1 Automotive H-Bridge Smart Gate Driver With Wide Common Mode Inline Current Sense Amplifier," 2021, Texas Instruments, 72 pages.
(Continued)

*Primary Examiner* — Thang X Le
(74) *Attorney, Agent, or Firm* — MUNCY, GEISSLER, OLDS & LOWE, P.C.

(57)          ABSTRACT

[Problem to be solved] The disclosure is to deal with a wide range of DC voltages in the input.
[Solution] In a current sense amplifier 100, an upper side voltage and a lower side voltage of a current detection resistor 2 are input thereto, and an output corresponding to a difference between the upper side voltage and the lower side voltage is obtained. A common mode voltage suppressor 12 includes: voltage division resistors R6*a* and R6*b*, the upper side voltage and the lower side voltage being supplied to the two ends thereof, and a division voltage being obtained; a first transistor M1, the upper side voltage being input to one end thereof, and the other end thereof being connected to a predetermined power supply; and a second transistor M2, the lower side voltage being input to one end thereof, and the other end thereof being connected to a predetermined power supply. A control end of the first transistor M1 and a control end of the second transistor M2 are commonly connected and the division voltage is input thereto.

6 Claims, 4 Drawing Sheets

(51) Int. Cl.
*G01R 19/10*              (2006.01)
*H03F 3/45*               (2006.01)

(58) Field of Classification Search
CPC ........... H03F 3/45762; H03F 2200/129; H03F
                                2200/261; H03F 2200/462
See application file for complete search history.

(56)                References Cited

U.S. PATENT DOCUMENTS

2019/0115874 A1\*    4/2019  Wan ................... H03F 3/45475
2024/0063767 A1\*    2/2024  Chiang .............. H03F 3/45753

OTHER PUBLICATIONS

"INA186 Bidirectional, Low-Power, Zero-Drift, Wide Dynamic
Range, Current-Sense Amplifier With Enable," 2021, Texas Instruments, 43 pages.
"INA296x-5 V to 110 V, Bidirectional, 1.1 MHz, 8 V/µs, Ultra-
Precise Current Sense Amplifier," 2023, Texas Instruments, 43
pages.

\* cited by examiner

CURRENT SENSE AMPLIFIER

BACKGROUND OF THE INVENTION

1. Field of the Invention

The disclosure relates to a current sense amplifier for detecting the current flowing through a current detection resistor.

2. Description of the Related Art

In a drive circuit for driving a load such as a motor, a drive transistor controlling a driving current is used. In order to control the driving current of the motor, it is necessary to detect the current flowing through the drive transistor, and a current sense amplifier is used to detect the driving current of the motor. In order to achieve good motor control, the current sense amplifier requires high speed, high precision, and low temperature drift.

Here, a power metal oxide semiconductor field effect transistor (MOSFET) is often used as the drive transistor, but the power MOSFET is relatively large to make a large current flow, and is often externally attached to a semiconductor substrate constituting the drive circuit for use.

In this case, the driving current of the motor can be detected by connecting a current detection resistor in series to the power MOSFET and detecting a voltage drop in the current detection resistor by the current sense amplifier.

PRIOR ART DOCUMENTS

Patent Documents

[Patent document 1] Japanese Patent Laid-Open No. 7-113826

SUMMARY OF THE INVENTION

Problems to be Solved

The current sense amplifier is used either on the upstream side (high side) or downstream side (low side) of the load depending on the application. For this reason, it is desirable that the current sense amplifier can deal with a wide range of DC voltage inputs.

In particular, for a current sense amplifier used on the high side, it has to operate in a case where the input voltage thereof is much higher than the power supply voltage of the amplifier itself.

Therefore, it is desirable that the current sense amplifier can set the gain or set the output offset voltage under the condition of being capable of dealing with a wide range of DC voltages in the input.

Means to Solve Problems

A current sense amplifier related to the disclosure is a current sense amplifier, to which an upper side voltage and a lower side voltage of a current detection resistor are input, and which obtains an output corresponding to a difference between the upper side voltage and the lower side voltage, wherein the current sense amplifier comprises a common mode voltage suppressor that suppresses the common mode voltage in the upper side voltage and the lower side voltage, the common mode voltage suppressor includes: a voltage division resistor, the upper side voltage and the lower side voltage being supplied to the two ends thereof, and a division voltage being obtained; a first transistor, the upper side voltage being input to one end thereof, and the other end thereof being connected to a predetermined power supply; and a second transistor, the lower side voltage being input to one end thereof, and the other end thereof being connected to a predetermined power supply; and a control end of the first transistor and a control end of the second transistor are commonly connected and the division voltage is input thereto.

Effects

By the common mode voltage suppressor, the common mode voltage in the input voltage can be suppressed, and thus it is possible to deal with a wide range of DC voltages in the input and set the gain or set the output offset voltage.

PREFERRED EMBODIMENT OF THE PRESENT INVENTION

Hereinafter, embodiments of the disclosure will be described with reference to the drawings. Note that, the following embodiments do not limit the scope of the disclosure, and configurations obtained by selectively combining multiple examples are also included in the disclosure.

Overall Configuration

Figure 1:
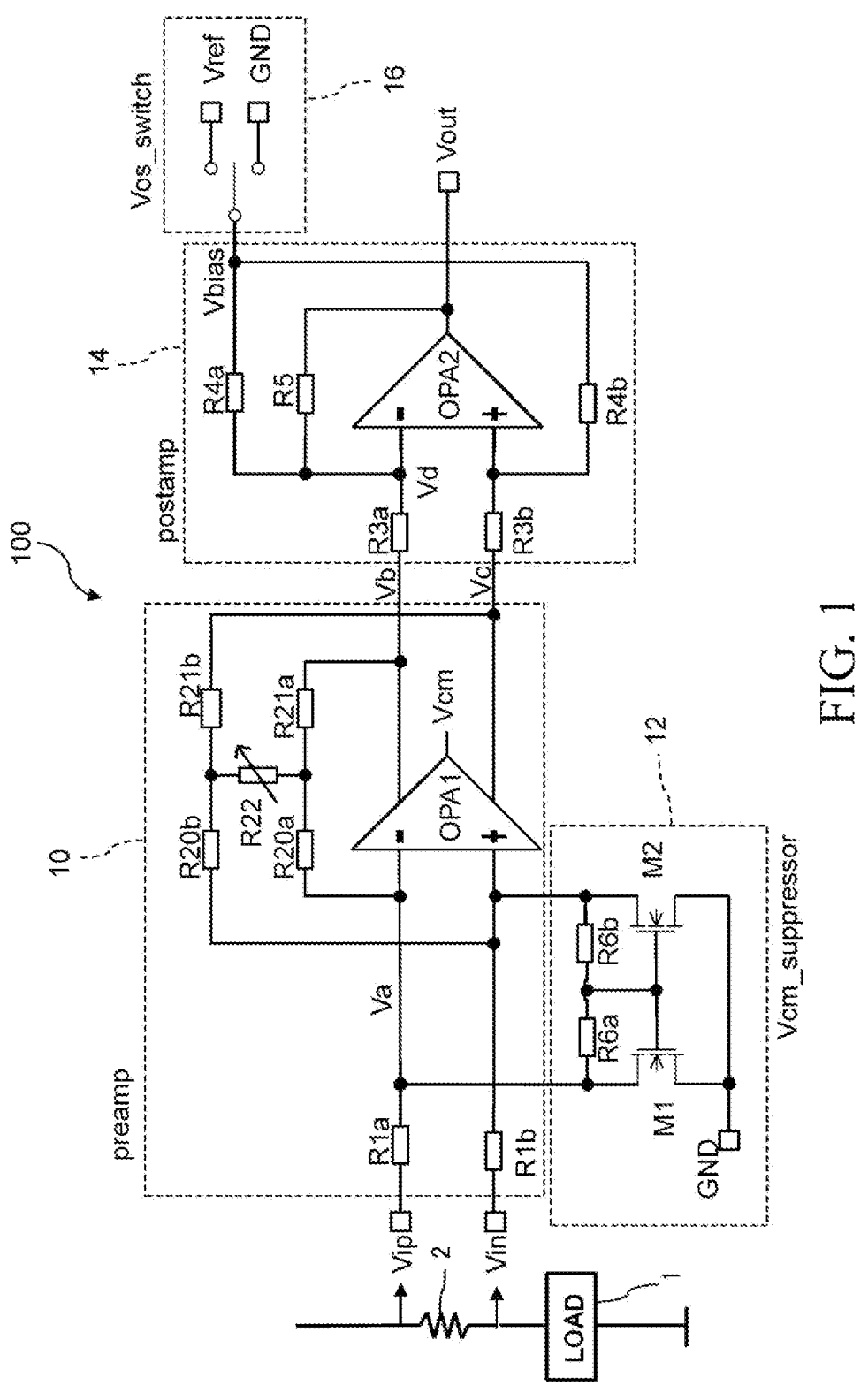
FIG. 1 is a circuit diagram showing the configuration of a current sense amplifier according to an embodiment.

FIG. 1 is a circuit diagram showing the configuration of a current sense amplifier according to an embodiment. A current sense amplifier 100 is a high-side current sense amplifier for detecting the current flowing through a current detection resistor 2 disposed on the upstream side of a load 1. Here, the load 1 is, for example, a motor, and the current flowing through the load 1 is controlled by a drive transistor (not shown) connected in series to the load 1 and the current detection resistor 2. For the current control, pulse width modulation (PWM) control is used, for example. In addition, as the transistor, a MOSFET (metal oxide semiconductor field effect transistor) is used, for example.

The current sense amplifier 100 includes four blocks, namely a preamplifier 10, a common mode voltage suppressor 12, a post-amplifier 14, and an offset voltage switch 16. The current sense amplifier 100 is generally formed on a semiconductor substrate as a semiconductor integrated circuit.

Voltages of two ends (upper side voltage Vip and lower side voltage Vin) of the current detection resistor 2 are input to the preamplifier 10, and a pair of voltages on the positive side and the negative side corresponding to a difference between these inputs are output as outputs Vc and Vb. The upper side voltage Vip is input to the negative input end (−) of an operational amplifier OPA1 via a resistor R1a. The lower side voltage Vin is input to the positive input end (+) of the operational amplifier OPA1 via a resistor Rib.

The operational amplifier OPA1 amplifies the difference between the inputs (upper side voltage Vip and lower side voltage Vin) with a common mode voltage Vcm as the center voltage. The negative input end and the negative output end of the operational amplifier OPA1 are connected by two resistors R20$a$ and R21$a$ connected in series. The positive input end and the positive output end are connected by two resistors R20$b$ and R21$b$ connected in series. And, the connection point of the two resistors R20$a$ and R21$a$ and the connection point of the two resistors R20$b$ and R21$b$ are connected by a variable resistor R22.

In this way, the preamplifier 10 is a fully differential amplifier, the gain is determined by the resistor values of the above-mentioned resistors R20$a$, R21$a$, R20$b$, R21$b$, and R22, and the gain of the operational amplifier OPA1 can be changed by changing the resistor value of the variable resistor R22. Therefore, the operational amplifier OPA1 can be made to operate by programmable gain settings. Note that the voltage of the negative input end of the operational amplifier OPA1 is set as Va, the voltage of the negative output end is set as Vc, and the voltage of the positive output end is set as Vb.

The common mode voltage suppressor 12 is connected to the positive and negative input ends of the operational amplifier OPAL. The negative input end of the operational amplifier OPA1 is connected to the drain of an n-channel transistor M1. The positive input end of the operational amplifier OPA1 is connected to the drain of an n-channel transistor M2. The gates of the transistors M1 and M2 are connected. The drains of the transistors M1 and M2 are connected by resistors R6$a$ and R6$b$ connected in series, and the connection point of the resistors R6$a$ and R6$b$ is connected to the gates of the transistors M1 and M2. In addition, the sources of the transistors M1 and M2 are connected to a ground GND, which is a predetermined power supply.

In this common mode voltage suppressor 12, it is desirable to use similar transistors for the transistors M1 and M2, and to make the resistor values of the resistors R6$a$ and R6$b$ the same. In this case, the mutual conductances of the transistors M1 and M2 are both gm, and the common mode impedance is 1/gm. In addition, the differential impedance is 2×R6 (R6$a$=R6$b$=R6).

Therefore, the voltage Va can be set to a low voltage by attenuation due to a magnitude difference between the resistors R1$a$ and Rib and the common mode impedance 1/gm. That is, even if the DC voltage of the input is 40 V, the voltage Va can be set near a threshold voltage Vth of the transistors M1 and M2.

In other words, even if the input DC component moves in a range of −2 V to +40 V, the negative input voltage Va and the common mode voltage Vcm of the preamplifier 10 can be maintained at the operating power supply voltage of the current sense amplifier 100, that is, 3 V, or less.

In this way, the common mode voltage suppressor 12 is connected to the preamplifier 10 and consumes a common-mode current flowing to the differential input of the preamplifier 10. For this reason, it is sufficient for the preamplifier 10 to only deal with a differential signal from the input.

The post-amplifier 14 has an operational amplifier OPA2 inside, and a pair of outputs Vb and Vc of the operational amplifier OPA1 are input thereto. The outputs Vb and Vc are input to the negative input end (−) and the positive input end (+) of the operational amplifier OPA2 through resistors R3$a$ and R3$b$, respectively.

The operational amplifier OPA2 is a single-ended operational amplifier with one output, and an output Vout, which is a voltage output, is obtained. And, the output Vout becomes an output signal of the current sense amplifier 100. In this way, an output signal suitable for an ADC (analog-to-digital converter) can be obtained by the operational amplifier OPA2.

In addition, the output end and the negative input end of the operational amplifier OPA2 are connected by a resistor R5, which is a feedback resistor. Furthermore, a bias voltage Vbias is supplied to the negative input end of the operational amplifier OPA2 via a resistor R4$a$ and to the positive input end of the operational amplifier OPA2 via a resistor R4$b$. Note that the voltage of the negative input end of the operational amplifier OPA2 is set as Vd.

With this configuration, the post-amplifier 14 outputs the output Vout corresponding to a difference between the outputs Vb and Vc of the preamplifier 10. In addition, the output Vout is formed by performing offset according to the voltage Vbias.

Here, the voltage Vbias is supplied from the offset voltage switch 16. The offset voltage switch 16 can set the voltage Vbias to either a reference voltage Vref or the ground GND. Therefore, by the offset voltage switch 16, two offset voltages can be switched and provided for the output of the post-amplifier 14.

By making the common mode voltage Vcm of the preamplifier 10 proportional to the reference voltage Vref, and constantizing the ratio of the resistors R4$a$ and R4$b$ disposed in the supply path of the voltage Vbias and the resistors R3$a$ and R3$b$ disposed in the input path of the operational amplifier OPA2, a desired offset voltage can be set for the output of the post-amplifier 14 by the offset voltage switch 16 having a simple configuration.

For example, the offset voltage of the output Vout can be selectively set to one of two offset values such as Vref/2 and Vref/8. Vref/2 is suitable for bipolar operation and Vref/8 is suitable for unipolar operation. Note that the setting of the offset voltage will be described later.

"About Functions of Preamplifier and Post-Amplifier"

<Gain of Preamplifier 10>

The gain of the preamplifier 10 will be described.

If the difference of the outputs of the preamplifier 10 is set as Vpreo, then $$Vpreo=Vc-Vb.$$

In addition, in this example, it is set that R1$a$=R1$b$=R1, R20$a$=R20$b$=R20, and R21$a$=R21$b$=R21.

Here, assuming that the common mode voltage is 0 V(Vcm=0), then $$Vip+Vin=0.$$

Therefore, $$Vip=-Vin, Vc=-Vb, \text{ and } Va=0,$$

and a gain Gpre of the preamplifier 10 is represented as follows.

$$Gpre=Vpreo/(Vip-Vin)=Vc/Vip$$

Next, the adjustment of the gain by the variable resistor R22 will be described.

If Vip/R1=i, the current on the negative side is set as ia, and the current on the positive side is set as ib, then $$R20*i=R22*ia/2, ia=i*2*R20/R22,$$

$$R21*(i+ia)+R20*i=Vc,$$

$$R21*(i+2*i*R20/R22)+R20*i=Vc,$$

$$i*[R20+R21*(1+2*R20/R22)]=Vc, \text{ and}$$

$Vip/R1*[R20+R21*(1+2*R20/R22)]=Vc.$

Therefore, the gain Gpre of the preamplifier 10 is represented as follows.

$Gpre=[R20+R21*(1+2*R20/R22)]/R1$

Therefore, the gain of the preamplifier 10 can be adjusted by adjusting the resistor value of the variable resistor R22.

If R22=∞, that is, if the variable resistor R22 is not arranged, the feedback resistor is R20+R21, and the gain becomes a normal gain as follows.

$Gpre=(R20+R21)/R1$

<Gain of Post-Amplifier>

A gain Gpost of the post-amplifier 14 will be described. Note that, it is set that R3a=R3b=R3 and R4a=R4b=R4.

The gain Gpost of the post-amplifier 14 is $Gpost=Vout/(Vc-Vb).$

The outputs Vb and Vc of the preamplifier 10 are represented as follows.

$Vb=-Vpreo/2+Vcm, Vc=Vpreo/2+Vcm$

Here, assuming that Vbias=0, it becomes as follows.

$Vd=Vc*R4/(R3+R4)$ $(Vout-Vd)/R5=Vd/R4+(Vd-Vb)/R3$ $Vout-Vd=Vd*(R5/R4+R5/R3)-Vb*R5/R3$ $Vout32Vd*[1+R5*(R3+R4)/(R3*R4)]-Vb*R5/$
$R3=Vc*R4*[1/(R3+R4)+R5/(R3*R4)]-Vb*R5/$
$R3=(Vpreo/2+Vcm)*[R4/(R3+R4)+R5/R3]+$
$(Vpreo/2-Vcm)*R5/R3=(Vpreo/2)*[R4/(R3+R4)+$
$2*R5/R3]+Vcm*R4/(R3+R4)=Vpreo*[(R4/2)/$
$(R3+R4)+R5/R3]+Vcm*R4/(R3+R4)$ The gain of the post-amplifier 14 is $Gpost=\Delta Vout/\Delta Vpreo,$ and becomes $Gpost=(R4/2)/(R3+R4)+R5/R3.$ That is, the gain can be set by the resistor values of the resistors R3, R4, and R5.

<About Offset Voltage of Output Vout>

When Vbias=0, the output Vout is represented as follows with respect to inputs Vip and Vin.

$Vout=Gpost*Gpre*(Vip-Vin)+Vcm*R4/(R3+R4)$

Here, Vip=Vin. Therefore, the output Vout is represented as follows.

$Vout=Vd=Vcm*R4/(R3+R4)+Vbias*R3/(R3+R4)$

A case when Vref is selected by the offset voltage switch 16, the offset voltage in Vout is set as Vref/2 is assumed.

When Vbias=Vref, Vout=Vref/2

In this case, the following formula holds.

$Vref/2=Vcm*R4/(R3+R4)+Vref*R3/(R3+R4)$

Next, a case when GND is selected by the offset voltage switch 16, the offset voltage in Vout is set as Vref/8 is assumed.

In a case where Vout=Vref/8 when Vbias=0, the following formula holds.

$Vref/8=Vcm*R4/(R3+R4)$

When both of the above two cases are made true, $Vref/2=Vref/8+Vref*R3/(R3+R4),$ $½=⅛+R3/(R3+R4)$ $⅜=R3/(R3+R4),$ and $R3:R4=3:5.$ Therefore, by setting R3:R4=3:5, the offset voltage of Vout can be set as Vref/2 by selecting Vref by the offset voltage switch 16, and the offset voltage of Vout can be set as Vref/8 by selecting GND by the offset voltage switch 16.

In addition, in the case of this setting, the common mode voltage Vcm of the preamplifier 10 is set as Vref/5 as follows.

$Vcm=Vref/8*(R3+R4)/R4=Vref/8*(3+5)/5=Vref/5$

In this way, in the current sense amplifier 100 shown in FIG. 1, when Vbias=0, $Vout=Gpost*Gpre*(Vip-Vin)+Vref/8,$ and when $Vbias=Vref,$ $Vout=Gpost*Gpre*(Vip-Vin)+Vref/2.$ In addition, the gains of the post-amplifier 14 and preamplifier 10 are represented as follows.

$Gpost=5/(2*8)+R5/R3=R5/R3+⅝$ $Gpre=[R20+R21*(1+2*R20/R22)]/R1$

Variation Example 1

Figure 2:
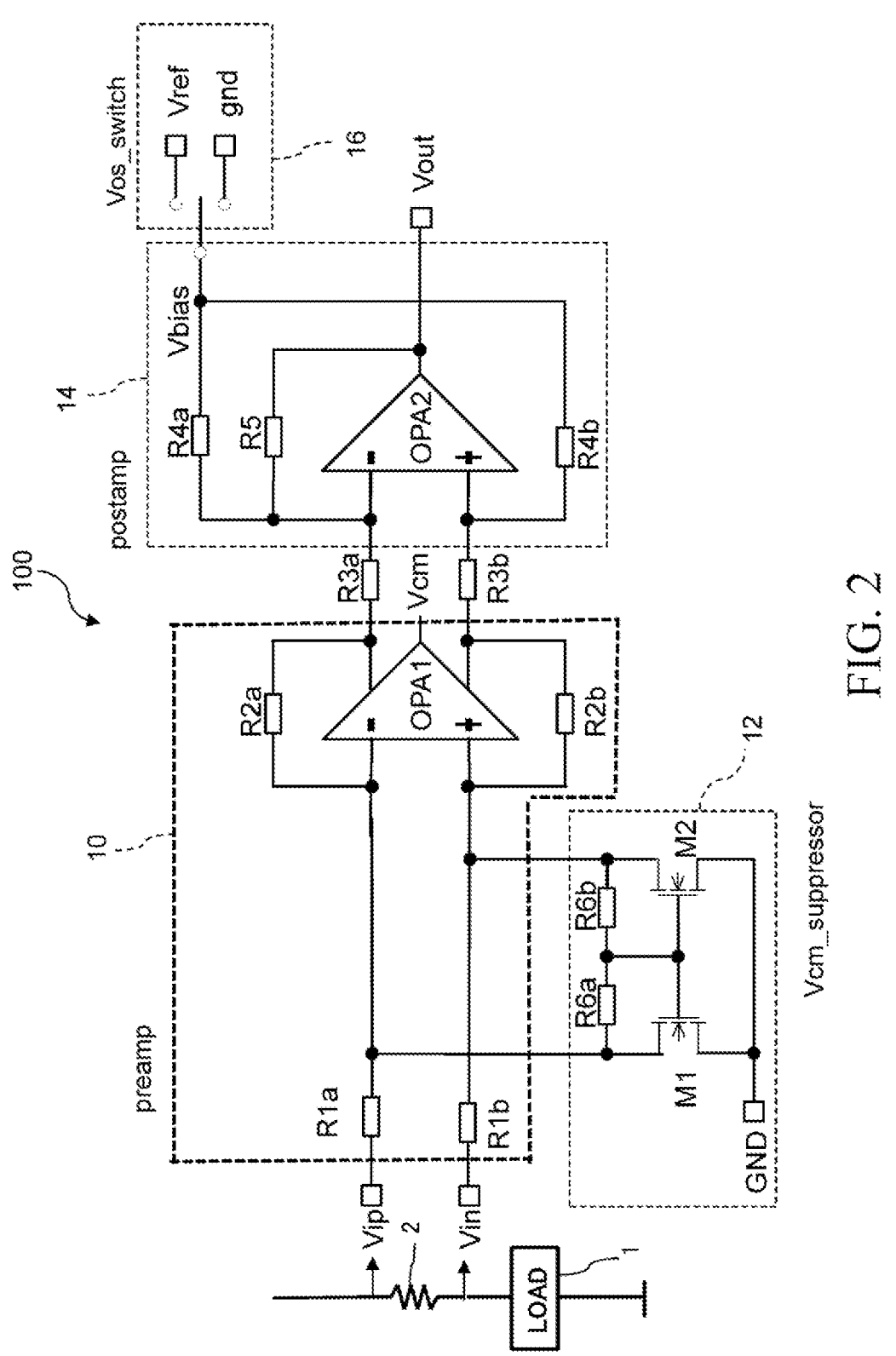
FIG. 2 is a circuit diagram showing the configuration of Variation example 1.

FIG. 2 is a circuit diagram showing the configuration of Variation example 1. In this example, the variable resistor R22 of the preamplifier 10 in FIG. 1 is removed. Therefore, the resistor of the feedback path does not need to be divided into two, and the resistors of the negative side feedback and the positive side feedback are respectively set to one resistor (R2a and R2b).

Here, if it is set that R2a=R2b=R2, the gain of the preamplifier 10 becomes Gpre=R2/R1. In this way, Variation example 1 is a single gain amplifier that cannot change the gain of the preamplifier 10.

Variation Example 2

Figure 3:
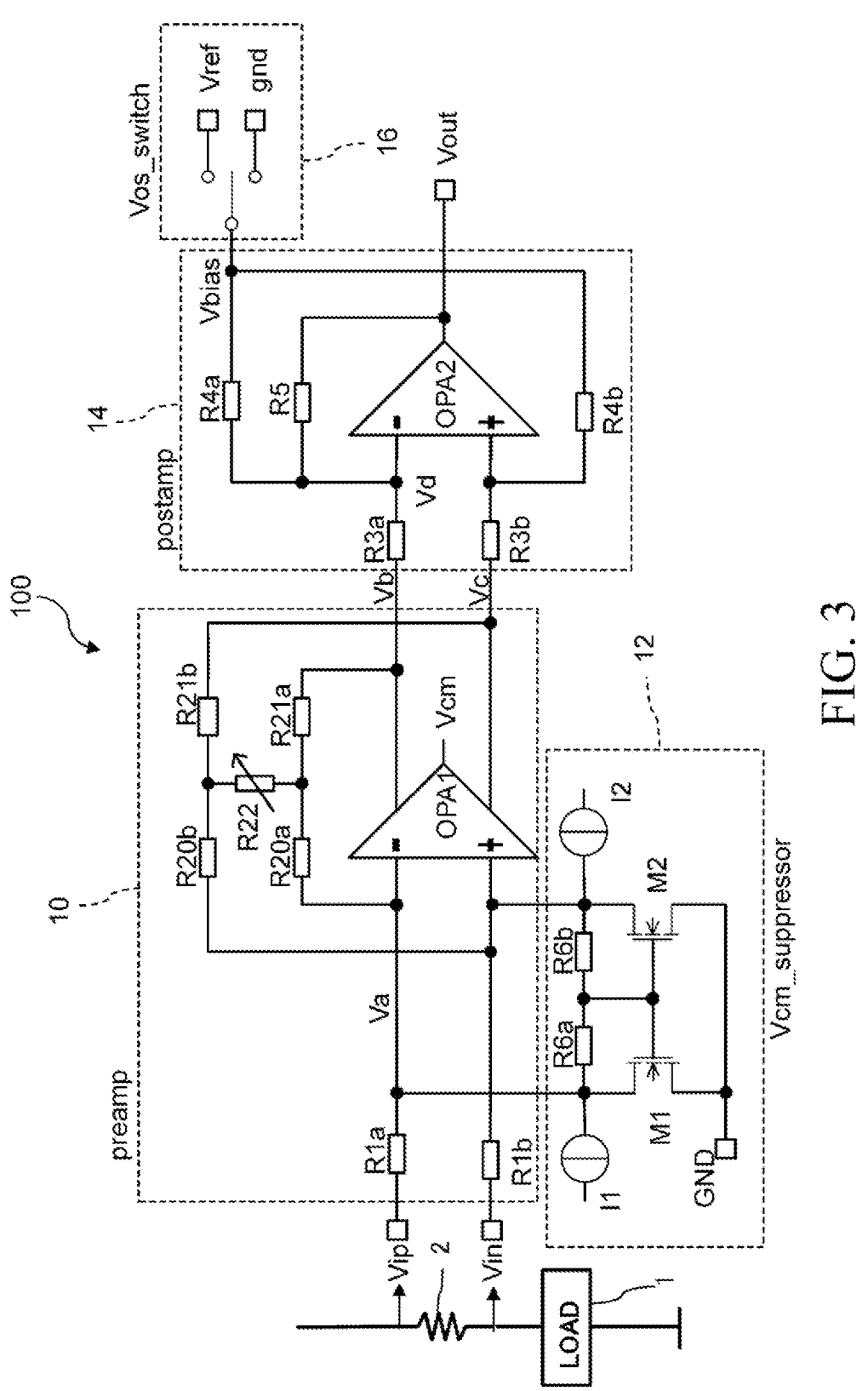
FIG. 3 is a circuit diagram showing the configuration of Variation example 2.

FIG. 3 is a circuit diagram showing the configuration of Variation example 2. In this example, current sources I1 and I2 are added to the common mode voltage suppressor 12. That is, the current sources I1 and I2 are connected to the drains of the transistors M1 and M2, and a constant current (bias current) is ensured in the transistors M1 and M2.

Therefore, even if sufficient common-mode current is not supplied through the inputs Vip and Vin, it can be prevented that the operation of the common mode voltage suppressor 12 becomes unstable.

Variation Example 3

Figure 4:
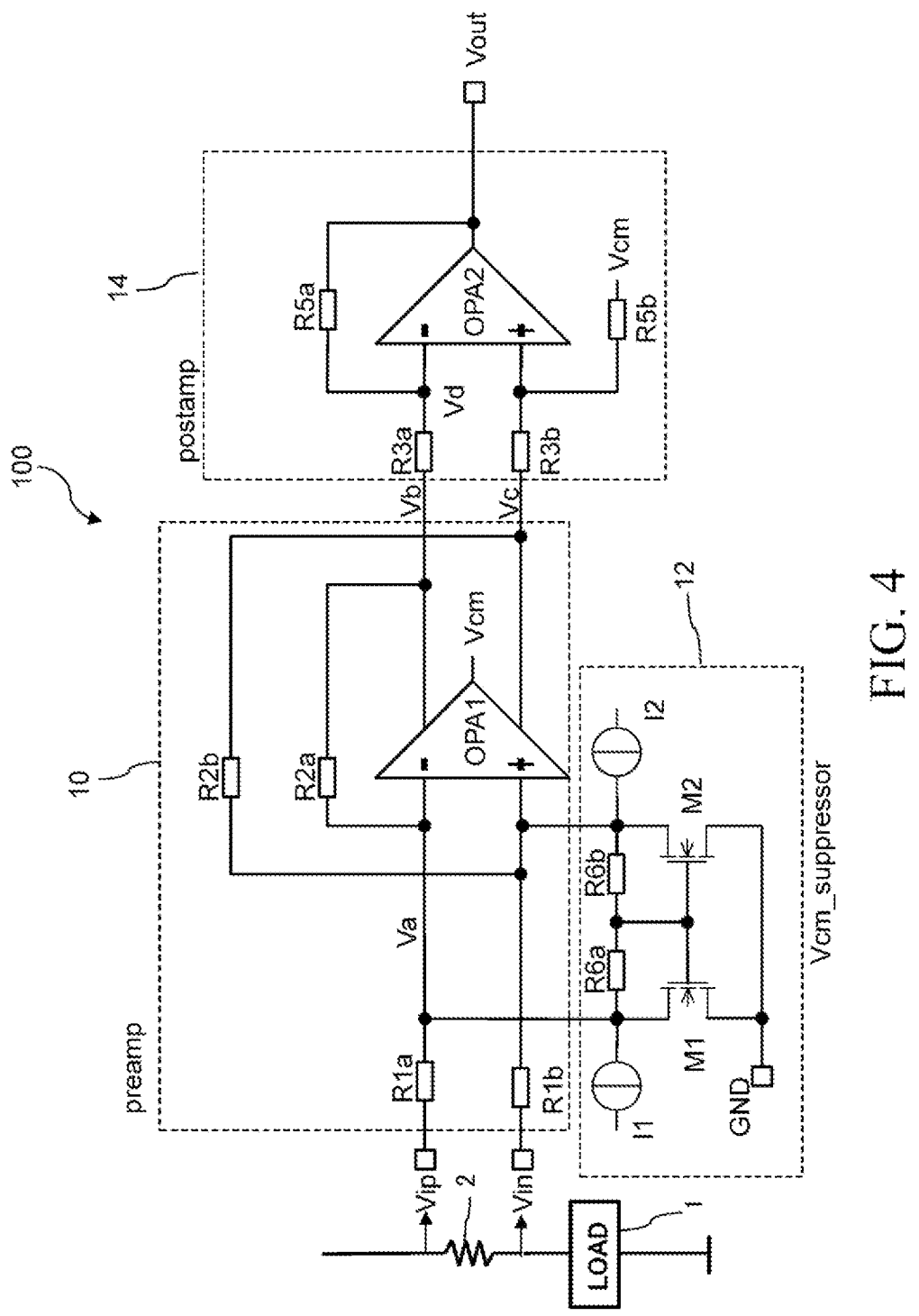
FIG. 4 is a circuit diagram showing the configuration of Variation example 3.

FIG. 4 is a circuit diagram showing the configuration of Variation example 3. In this example, current sources I1 and I2 are added to the common mode voltage suppressor 12 as in the configuration of FIG. 3, and the feedback resistor of the preamplifier 10 is set to two resistors, namely R2a and R2b, as in the configuration of FIG. 2.

Furthermore, a resistor R5a is adopted as the negative feedback resistor of the operational amplifier OPA2, and the voltage Vcm is supplied to the positive input end via the resistor R5b. In addition, the offset voltage switch 16 and the resistors R4a and R4b are removed. Thereby, the gain of the post-amplifier 14 is determined by the resistors R3*a* and R5*a*, and the offset voltage is determined by the resistors R3*b* and R5*b*.

DESCRIPTION OF THE REFERENCE NUMERALS

1: load
2: current detection resistor
10: preamplifier
12: common mode voltage suppressor
14: post-amplifier
16: offset voltage switch
100: current sense amplifier
What is claimed is:

1. A current sense amplifier having inputs being connected to an upper side voltage and a lower side voltage of a current detection resistor, and configured to provide an output corresponding to a difference between the upper side voltage and the lower side voltage, the current sense amplifier comprises;

a common mode voltage suppressor that suppresses a common mode voltage in the upper side voltage and the lower side voltage, the common mode voltage suppressor including:

a voltage division resistor having one end being connected to the upper side voltage and the other end being connected to the lower side voltage, and configured to provide a division voltage;

a first transistor having one end being connected to the upper side voltage and the other end being connected to a predetermined power supply; and a second transistor having one end being connected to the lower side voltage and the other end thereof being connected to the predetermined power supply; and a control end is commonly connected to a gate of the first transistor and a gate of the second transistor, and the division voltage is inputted to the control end.

2. The current sense amplifier according to claim 1, wherein the first and second transistors are n-channel MOSFETs.

3. The current sense amplifier according to claim 1, further comprising:

a preamplifier having inputs being connected to the upper side voltage and the lower side voltage, and outputting a positive output and a negative output corresponding to a voltage difference between the upper side voltage and the lower side voltage;

and a post-amplifier having inputs being connected to the positive output and the negative output of the preamplifier.

4. The current sense amplifier according to claim 3, wherein the post-amplifier is supplied with a reference voltage, and sets an offset voltage of the output of the post-amplifier by a combination of resistors entering between an input end of the reference voltage and two outputs of the preamplifier.

5. The current sense amplifier according to claim 4, wherein the reference voltage has two types and is switchable.

6. The current sense amplifier according to claim 1, further comprising:

a first constant current source, which supplies a constant current to one end of the first transistor; and a second constant current source, which supplies a constant current to one end of the second transistor.

* * * * *